United States Patent
Carothers et al.

(10) Patent No.: US 7,572,482 B2
(45) Date of Patent: Aug. 11, 2009

(54) PHOTO-PATTERNED CARBON ELECTRONICS

(75) Inventors: Daniel N Carothers, Milford, NH (US); Rick Thompson, Amherst, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 630 days.

(21) Appl. No.: 11/404,435

(22) Filed: Apr. 14, 2006

(65) Prior Publication Data

US 2007/0243319 A1 Oct. 18, 2007

(51) Int. Cl.
C25B 11/00 (2006.01)

(52) U.S. Cl. .................. 427/121; 427/563; 204/280

(58) Field of Classification Search ........... 427/563, 427/121; 204/280
See application file for complete search history.

(56) References Cited

U.S. PATENT DOCUMENTS

| | | | |
|---|---|---|---|
| 5,674,355 A | 10/1997 | Cohen et al. | |
| 5,810,945 A | 9/1998 | Stutzmann et al. | |
| 6,333,519 B1 | 12/2001 | Nakazawa | |
| 6,764,958 B1* | 7/2004 | Nemani et al. | 438/758 |
| 6,831,017 B1 | 12/2004 | Li et al. | |
| 7,001,850 B2* | 2/2006 | Nemani et al. | 438/758 |
| 7,117,064 B2* | 10/2006 | Nemani et al. | 700/121 |
| 2005/0020048 A1* | 1/2005 | Nemani et al. | 438/597 |
| 2005/0255702 A1 | 11/2005 | Honeycutt et al. | |
| 2006/0046200 A1 | 3/2006 | Abatchev et al. | |
| 2006/0141805 A1* | 6/2006 | Nemani et al. | 438/758 |
| 2007/0243319 A1* | 10/2007 | Carothers et al. | 427/121 |
| 2008/0132047 A1* | 6/2008 | Dunne et al. | 438/527 |
| 2008/0150091 A1* | 6/2008 | Lin | 257/635 |
| 2009/0079075 A1* | 3/2009 | Lin et al. | 257/739 |
| 2009/0079076 A1* | 3/2009 | Lin et al. | 257/739 |

OTHER PUBLICATIONS

PCT Search Report dated Mar. 24, 2008 of Patent Application No. PCT/US07/09110 filed Apr. 13, 2007.
Salama, I.A. et al., "Laser direct writing and doping of diamond-like carbon, polycrystalline diamond, and single crystal silicon carbide", Journal of Laser Applications, May 2004, pp. 92-99, vol. 16, No. 2.

* cited by examiner

*Primary Examiner*—Laura M Menz
(74) *Attorney, Agent, or Firm*—Andrew P. Cernota; Vern Maine & Associates (57) ABSTRACT

A system is provided for the manufacture of carbon based electrical components including, an ultraviolet light source; a substrate receiving unit whereby a substrate bearing a first layer of carbon based semiconductor is received and disposed beneath the ultraviolet light source; a mask disposed between the ultraviolet light source and the carbon based semiconductor layer; a doping agent precursor source; and environmental chemical controls, configured such that light from the ultraviolet light source irradiates a doping agent precursor and the first carbon layer.

13 Claims, 10 Drawing Sheets

PHOTO-PATTERNED CARBON ELECTRONICS

FIELD OF THE INVENTION

The invention relates to the manufacture of carbon based semiconductor components, and more particularly, to photo patterned carbon electrical components and a method for the manufacture thereof.

BACKGROUND OF THE INVENTION

Known methods of forming semiconductor electronic components require successive masking and photo-etching steps through which horizontal structures and doped layers of semi-conductors are built up from a substrate. The components thus produced are typically comprised of silicon, gallium, indium, and other p-bock semi-metallic elements to which dopants are introduced to effect changes in the electronic configuration of the semiconductor crystal. In use, known semiconductors generate heat, and lose effectiveness when in high heat environments. Consequently, cooling systems, such as heat sinks and fans are typically be employed to prevent heat damage to the electronic component, and in high speed and high voltage applications, special selections of materials are made. Known materials, even those specifically selected for their thermal properties, perform suboptimally in high temperature environments.

Recently, the unique electrical and thermal properties of various allotropes of carbon, such as carbon nanotubes and diamond-like carbon, and other organic compounds like graphene have been the object of much study. The creation of effective electrical components that incorporate the useful properties of carbon allotropes and molecules into semiconductor electronics, such as transistors have been theorized. While the properties of these carbon molecules make them the subject of much interest as potential semiconductors, suitable doping techniques have proved illusive.

What is needed, therefore, are techniques for producing cost effective carbon based semiconductor electrical components.

SUMMARY OF THE INVENTION

One embodiment of the present invention provides a system for the manufacture of carbon based electrical components, the system comprising: a ultraviolet light source; a substrate receiving unit whereby a substrate bearing a first layer of carbon based semiconductor is received and disposed beneath the ultraviolet light source; a mask disposed between the ultraviolet light source and the first layer of carbon based semiconductor; and a doping agent precursor source; and environmental chemical controls, configured such that light from the ultraviolet light source irradiates a doping agent precursor and the first carbon layer.

Another embodiment of the present invention provides such a system wherein the ultraviolet light source emits light in a spectrum selected from the group of spectra consisting of Deep Ultraviolet Light and Extreme Ultraviolet Light.

A further embodiment of the present invention provides such a system wherein the ultraviolet light source comprises a stepper laser.

Yet another embodiment of the present invention provides such a system further comprising an optical component disposed between the mask and the first layer of carbon based semiconductor.

A yet further embodiment of the present invention provides such a system wherein the optical component comprises at least one optical component selected from the group of optical components consisting of a lenses, arrays of lenses, diffraction gratings, optical wave guides, and mirrors.

Still another embodiment of the present invention provides such a system, wherein the optical component is resistant to chemical attack.

A still further embodiment of the present invention provides such a system further comprising a docked coating tool communicating with the substrate receiving unit, whereby the substrate wafer is received and coated with the first carbon layer.

Even another embodiment of the present invention provides such a system wherein the docked coating tool is configured to provide at least a second carbon layer and reintroduce the substrate layer and the first carbon layer, together with the second carbon layer to the receiving unit.

An even further embodiment of the present invention provides such a system wherein the doping agent precursor source is a gas supply.

Still yet another embodiment of the present invention provides such a system wherein the doping agent precursor source is a condensed phase fluid configured to apply the doping agent precursor to the first carbon layer by spinning.

A still even further embodiment of the present invention provides such a system wherein the doping agent precursor is selected from the group of doping agent precursors consisting of $COF_2$, $CF_2Cl_2$, $CF_2Br_2$, $CF_3Br$, $CF_3I$, $CF_3NO$, $CO(CF_3)$, Cesium, Potassium, Hydrogen, Oxygen, Fluorine dimer, Chlorine dimer, and Iodine dimer.

Even yet another embodiment of the present invention provides such a system wherein the environmental chemistry controls are configured to substantially exclude non-selected doping agent precursors.

An even yet further embodiment of the present invention provides such a system wherein the system comprises components resistant to chemical attack.

One embodiment of the present application provides a method for the production of carbon based electrical components, that method comprising: providing a wafer substrate; depositing upon the wafer substrate a first layer of carbon based semiconductor; introducing the first layer of carbon based semiconductor to a first doping agent precursor; irradiating the first doping agent precursor and the first layer of carbon based semiconductor with light having a wavelength in the ultraviolet spectrum thereby selectively doping areas of the first layer of carbon based semiconductor.

Another embodiment of the present invention provides such a method wherein the method further comprises: depositing a second layer of carbon based semiconductor upon the first layer of carbon based semiconductor; introducing the second layer of carbon based semiconductor to the first doping agent precursor; and irradiating the first doping agent precursor and the second layer of carbon based semiconductor thereby selectively doping areas of the second layer of carbon based semiconductor.

A further embodiment of the present invention provides such a method wherein the doping agent precursor is selected from the group of doping precursors consisting of $COF_2$, $CF_2Cl_2$, $CF_2Br_2$, $CF_3Br$, $CF_3I$, $CF_3NO$, $CO(CF_3)$, Cesium, Potassium, Hydrogen, Oxygen, Fluorine dimer, Chlorine dimer, and Iodine dimer.

Yet another embodiment of the present invention provides such a method further comprising the steps of: introducing the first layer of carbon based semiconductor to a second doping agent precursor; irradiating the second doping agent precursor and the first layer of carbon based semiconductor with a laser thereby selectively doping areas of the first layer of carbon based semiconductor.

A yet further embodiment of the present invention provides such a method wherein the first carbon layer is comprised of a carbon layer having a structure selected from the group of structures consisting of graphene, diamond-like carbon, single walled nanotube mats; sp2 bonded carbon molecules, and carbon molecules having both sp2 and sp3 bonded carbon centers.

Still another embodiment of the present invention provides such a method further comprising depositing and irradiating a plurality of carbon layers.

A still further embodiment of the present invention provides such a method further comprising: selecting a photolithography mask having a desired doping pattern; and disposing the photolithography mask between the light and the first layer.

One embodiment of the present invention provides a carbon based electrical component, that carbon based electrical component comprising: a three dimensional carbon based electrical circuit comprising a plurality of layers of carbon material; at least one section of each layer in the plurality of layers being doped in at least one layer doping pattern; the at least one layer doping pattern of each the layer being aligned to the at least one layer doping pattern in an adjacent layer of the plurality of layers so as to produce a desired vertical circuit.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

One embodiment of the present invention provides a method for the production of semiconductor component using deep ultraviolet (DUV) and extreme ultraviolet (EUV) radiation to induce the adsorption of doping agents into a carbon semiconductor.

In one such embodiment, photolithographic masking may be employed to expose patterns on a region of a workpiece to radiation in the UV radiation.

Diamond Like Carbon (DLC) thin films and Single wall nanotubes (SWNTs) have electrical and chemical properties making them especially suitable for semi conductor structures. In their un-doped state, DLCs are insulators, while SWNTs have a slight N-type bias. Diamond-like Carbon films have a high hardness, are chemically inert, and exhibit a high degree of thermal conductivity.

In one embodiment SWNTs may be doped by the introduction of halide or alkali metals as electron acceptors or donators, respectively. As uptake of dopant by both DLC thin films and SWNTs can be controlled by exposure to ultraviolet light, ultraviolet light may be used to effect a change in the electrical character of the structure.

ArF or KrF laser radiation is used, in some embodiments to dissociate halide molecules producing halogen radicals, while other embodiments utilize such radiation to increase the energy of the molecules facilitating bonding with the carbon based layers. Compounds used as doping precursors include, but are not limited to, $COF_2$, $CF_2Cl_2$, $CF_2Br_2$, $CF_3Br$, $CF_3I$, $CF_3NO$, and $CO(CF_3)$. Gas phase Group 1 metals may likewise be used, such as Cesium or Potassium.

In one embodiment, dissociation of these molecules generates highly reactive radicals. DLC films and SWNTs are exposed to the highly reactive radicals thus produced. The reactive radicals bond with the DLC films and SWNTs.

In some embodiments, inorganic gas sources may be provided, introducing simple gas phase inorganic molecules, including but not limited to hydrogen dimer, oxygen dimer. It has been found that the introduction of such simple inorganic compounds into the gas permits greater control of the material properties of the resulting semiconductor.

Chemisorption of Hydrogen or Oxygen can give rise to insulative properties. While in some applications this may be valuable, in one embodiment of the present invention, the doping process is conducted in a closed environment from which Hydrogen and Oxygen are substantially excluded. As these atmospheric gases are light dissociative or excitable and reactive, their presence between the light source's lens and the wafer would lead to unwanted modification of the electrical properties of the wafer.

Figure 1:
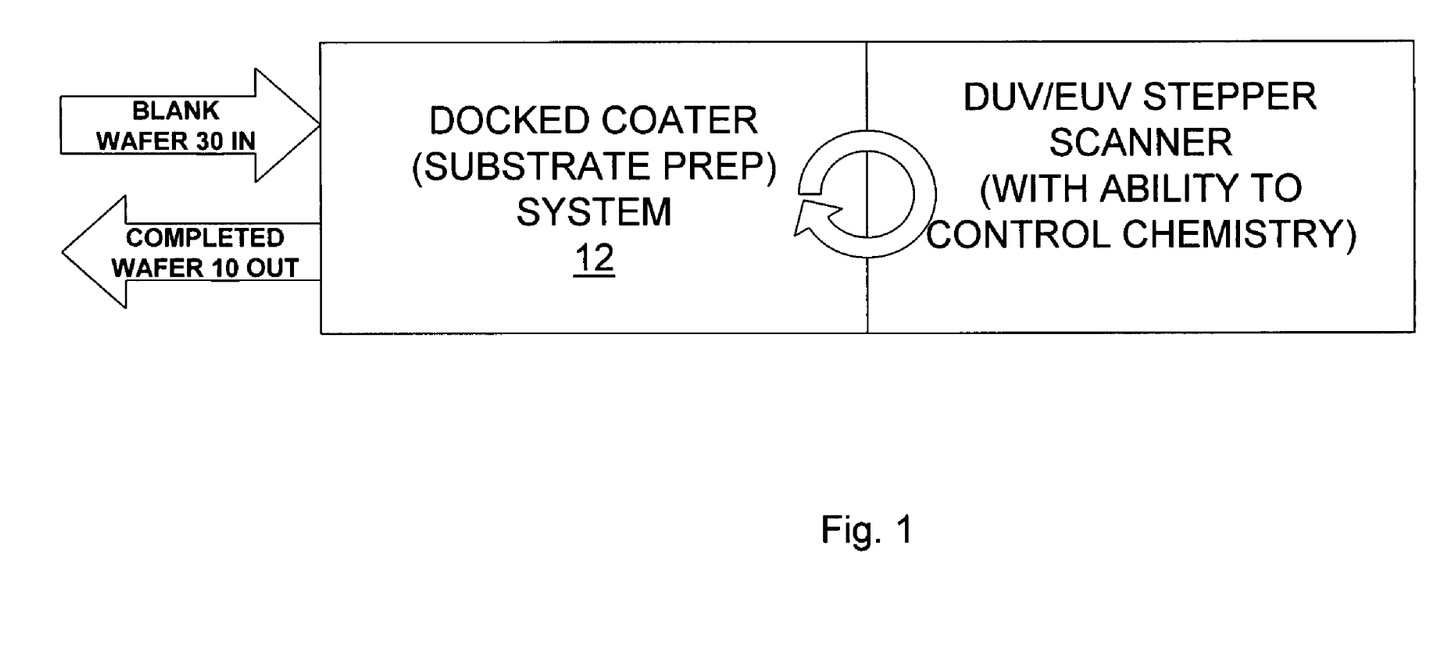
FIG. 1 is a block diagram illustrating a method for processing of a carbon based semiconductor configured in accordance with one embodiment of the present invention.
Figure 2:
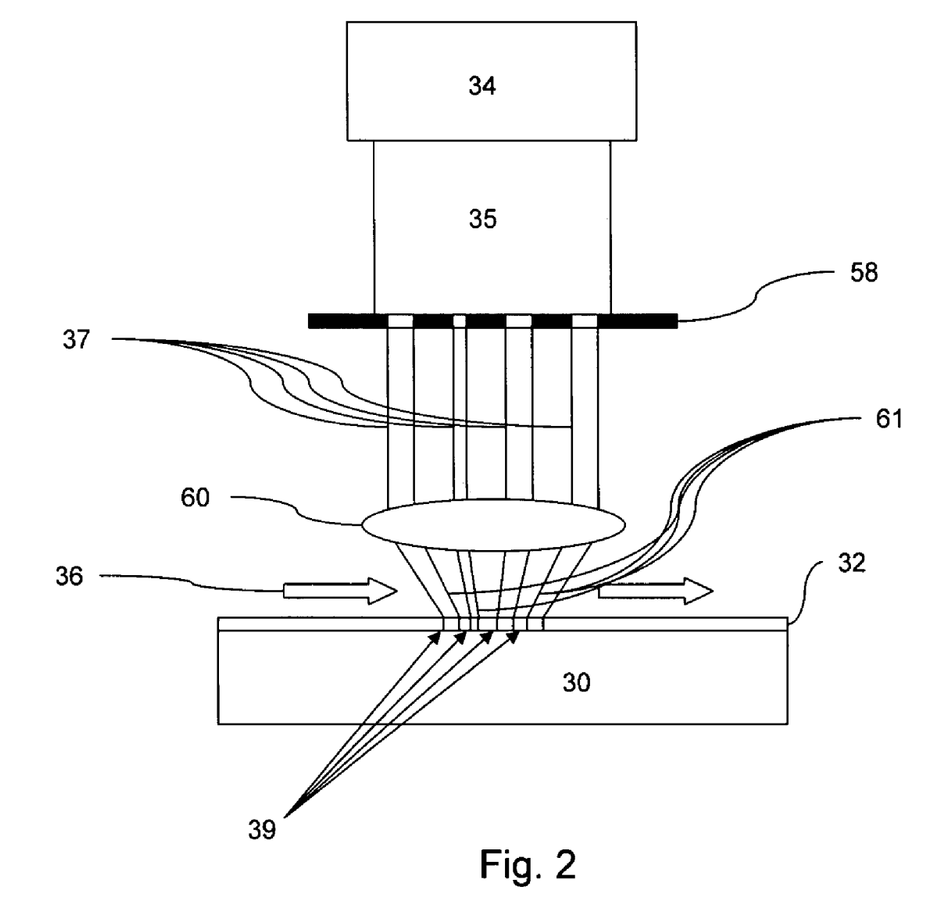
FIG. 2 is a block diagram illustrating an apparatus for processing of a carbon based semiconductor configured in accordance with one embodiment of the present invention.

As illustrated in FIGS. 1 and 2 a block diagram illustrating a system configured according to one embodiment of the present invention. In this system a docked coater 12 received a substrate wafer 30, the substrate wafer 30 is coated with a layer of carbon or carbon based semiconductor 32. The carbon layer 32 is introduced to a processing unit, which in one embodiment is a DUV/EUV stepper scanner. The stepper scanner may include a Deep Ultraviolet or Extreme Ultraviolet light source 34 is equipped with the capacity to control the chemistry of the process environment. Within the system, a wafer 30 and subsequent carbon layers 32 may be coated by the coater 12 and irradiated by stepper 34 a number of iterations until a completed electrical component is produced without cleaning or etching of the work piece. The completed wafer 10 is then expelled from the docked coater 12.

As illustrated in FIG. 2 a mask, such as a photo lithographic mask 58, is disposed in the path of an ultraviolet light source. Various photolithographic masks are known to those skilled in the art. The emitted light 35 passes from a light source 34 through the mask 58 becoming masked or patterned light 37 and is concentrated through optical components 60 as a focused patterned light 61. The focused patterned light 61 is thus restricted or directed to regions 39 corresponding to a pattern 62 controlled by the mask 58 and the optics 60. The light 61 locally and instantaneously energizes a fluid 36 passing beneath the focused patterned light 61. A more efficient patterning may thus be obtained than through direct, unmasked scanning and narrowly targeted illumination of the workpiece surface as masked regions of the workpiece may be illuminated, effecting excitation of both the fluid 36 and the layer 32.

Figure 3A:
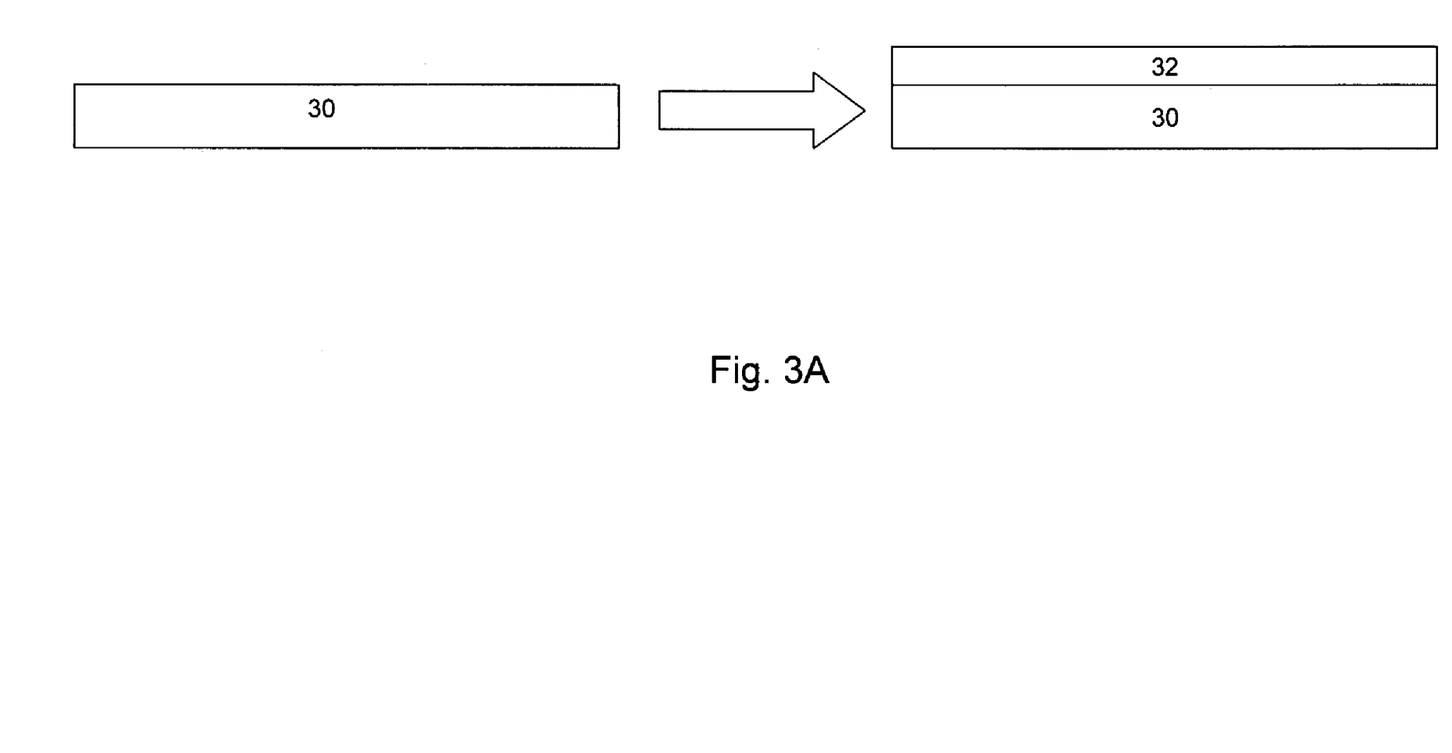
FIG. 3A is a block diagram illustrating a deposition step in a method for processing of a carbon based semiconductor configured in accordance with one embodiment of the present invention.
Figure 3B:
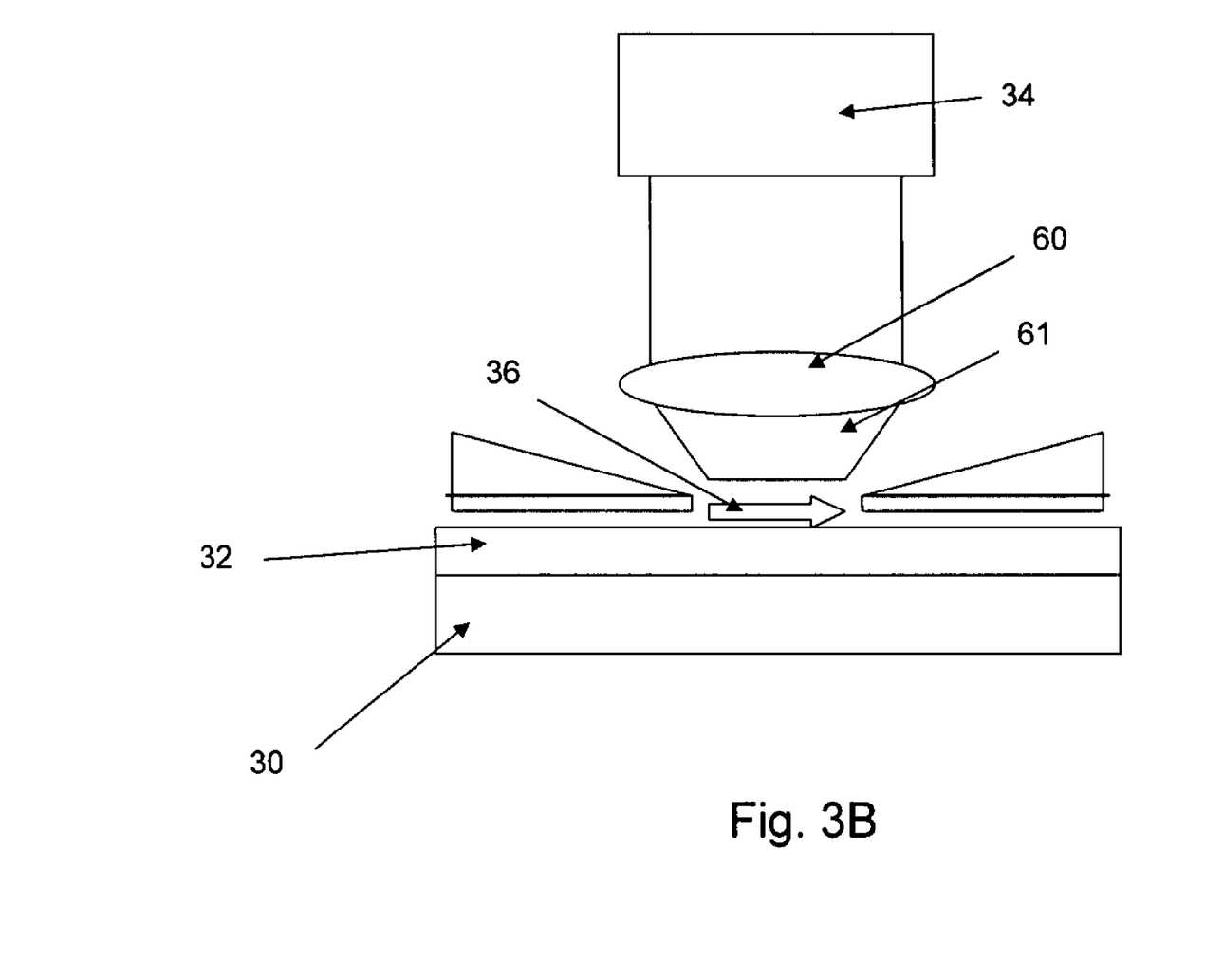
FIG. 3B is a block diagram illustrating a photo excitation step in a method for processing of a carbon based semiconductor configured in accordance with one embodiment of the present invention.
Figure 3C:
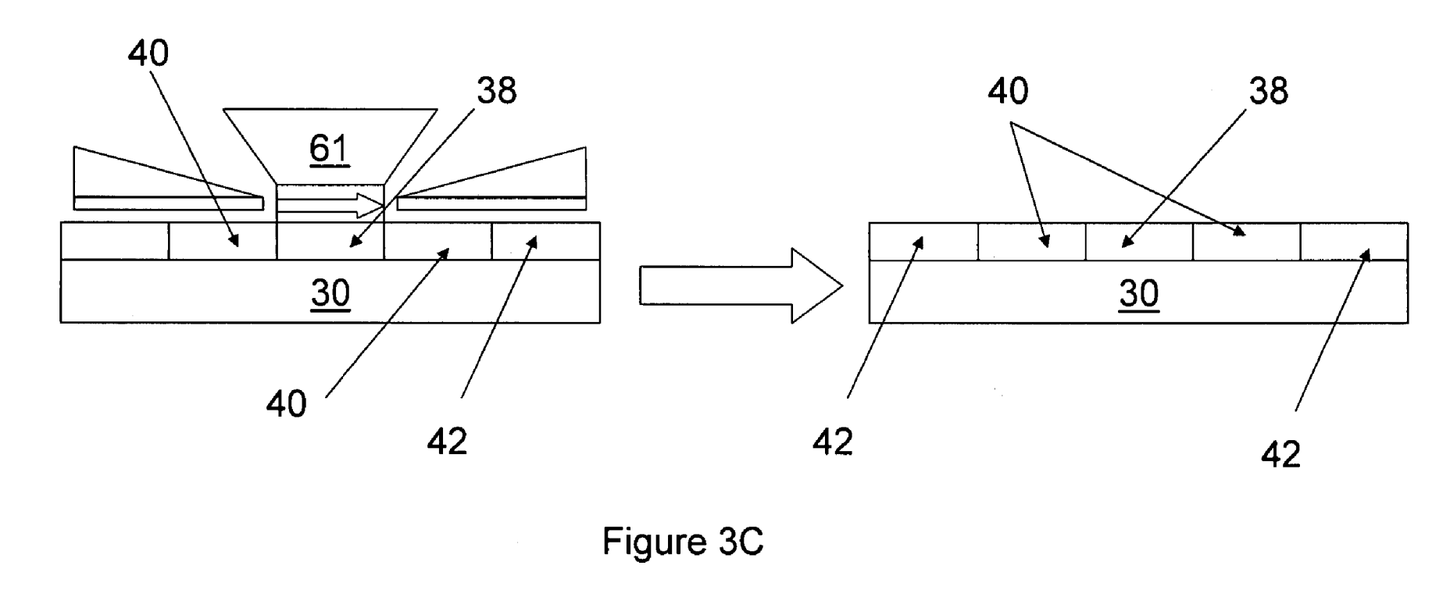
FIG. 3C is a block diagram illustrating a detail of a deposition step in a method for processing of a carbon based semiconductor configured in accordance with one embodiment of the present invention.
Figure 3D:
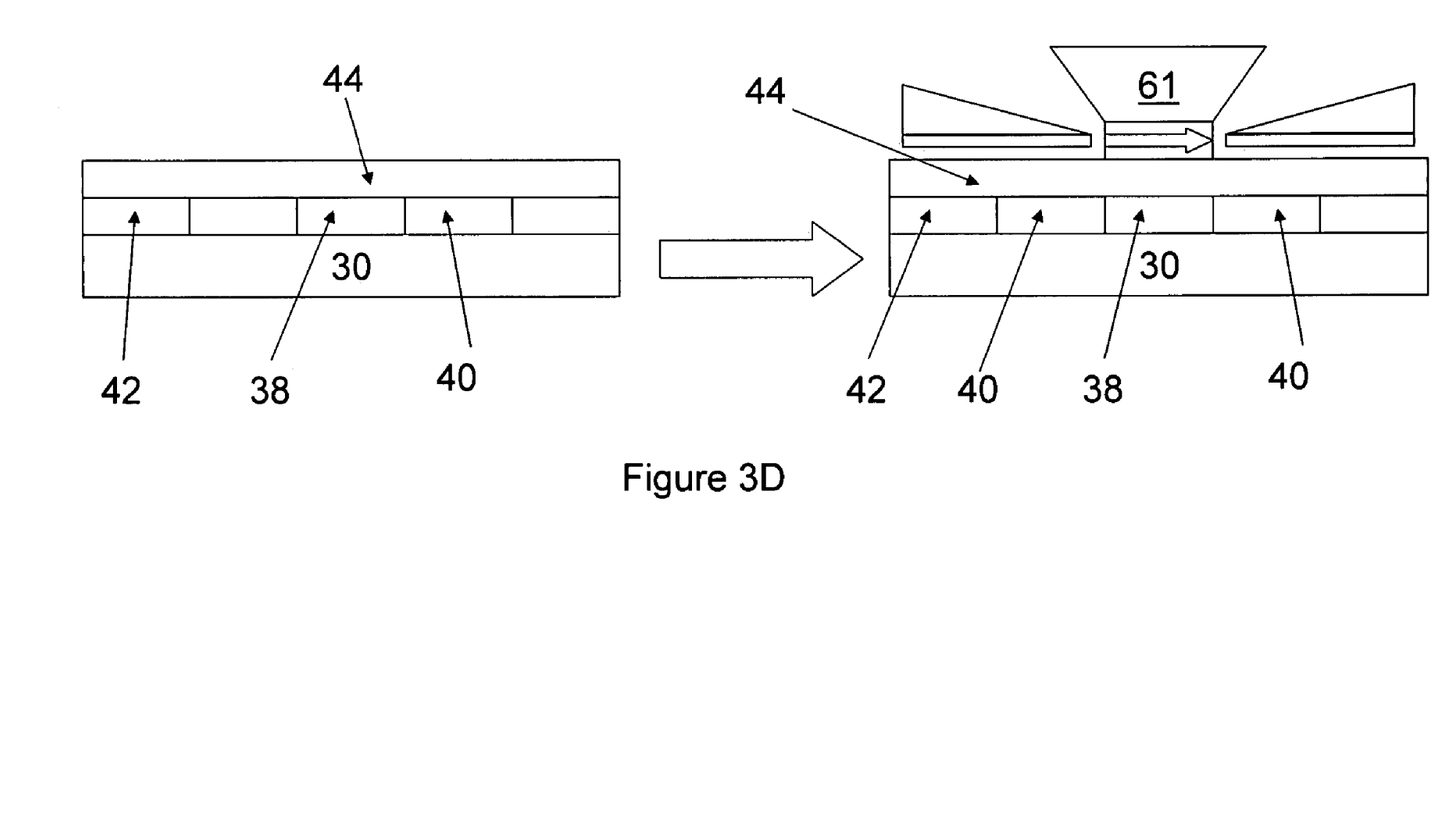
FIG. 3D is a block diagram illustrating a subsequent deposition and excitation step in a method for processing of a carbon based semiconductor configured in accordance with one embodiment of the present invention.
Figure 3E:
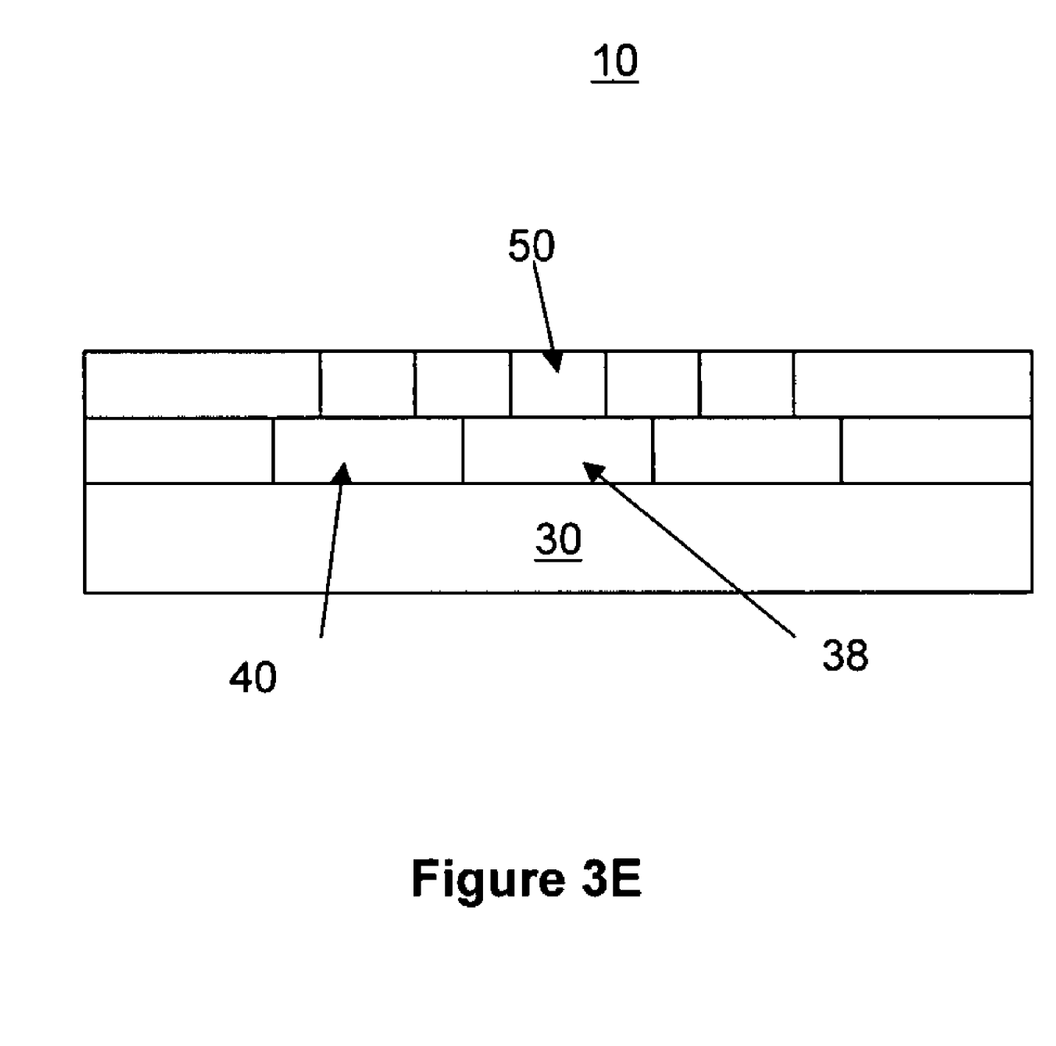
FIG. 3E is an elevation view of a multilayer carbon based semiconductor configured in accordance with one embodiment of the present invention.
Figure 3F:
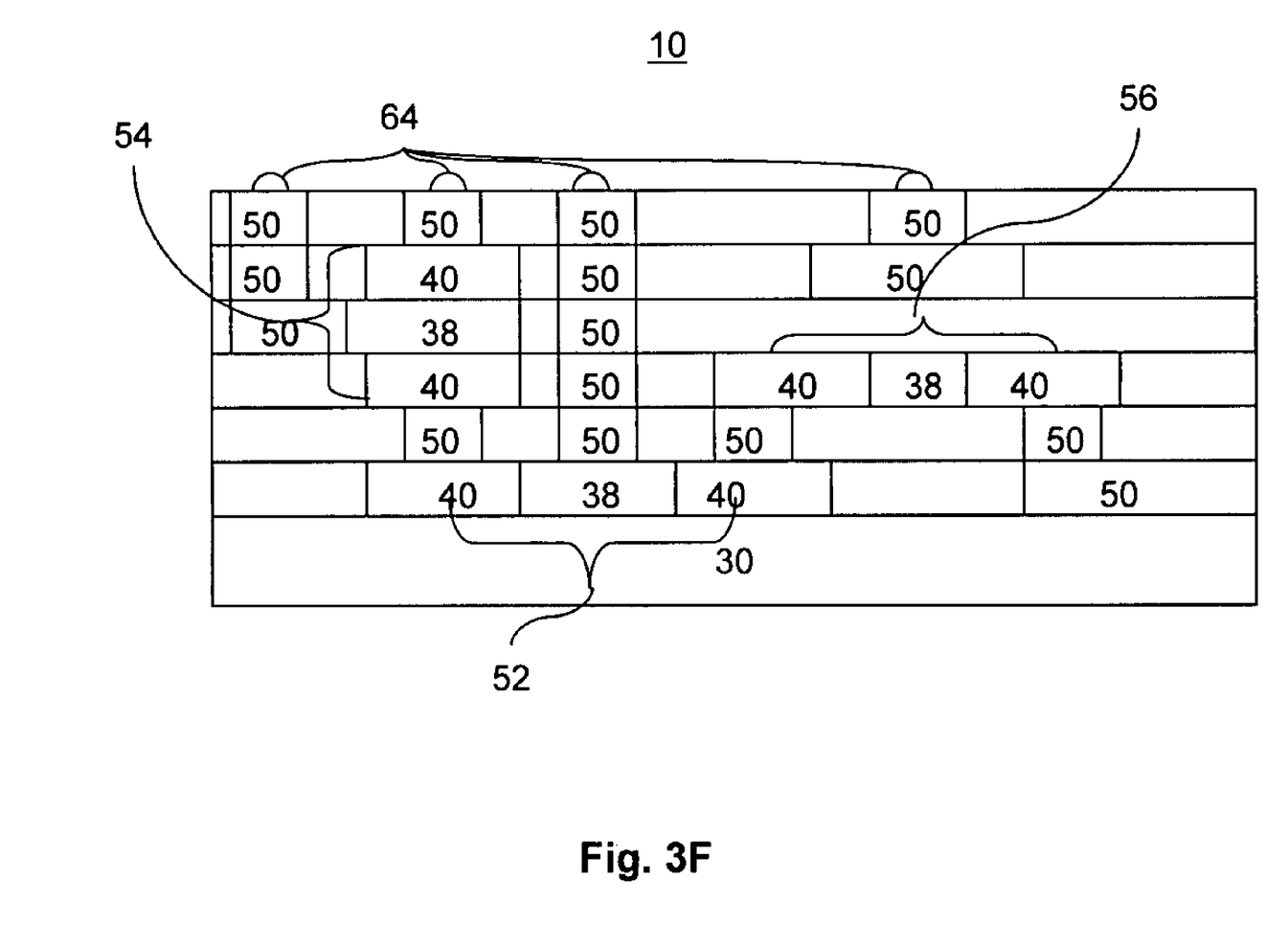
FIG. 3F is an elevation view of a three dimensional multilayer carbon based semiconductor circuit configured in accordance with one embodiment of the present invention.
Figure 4:
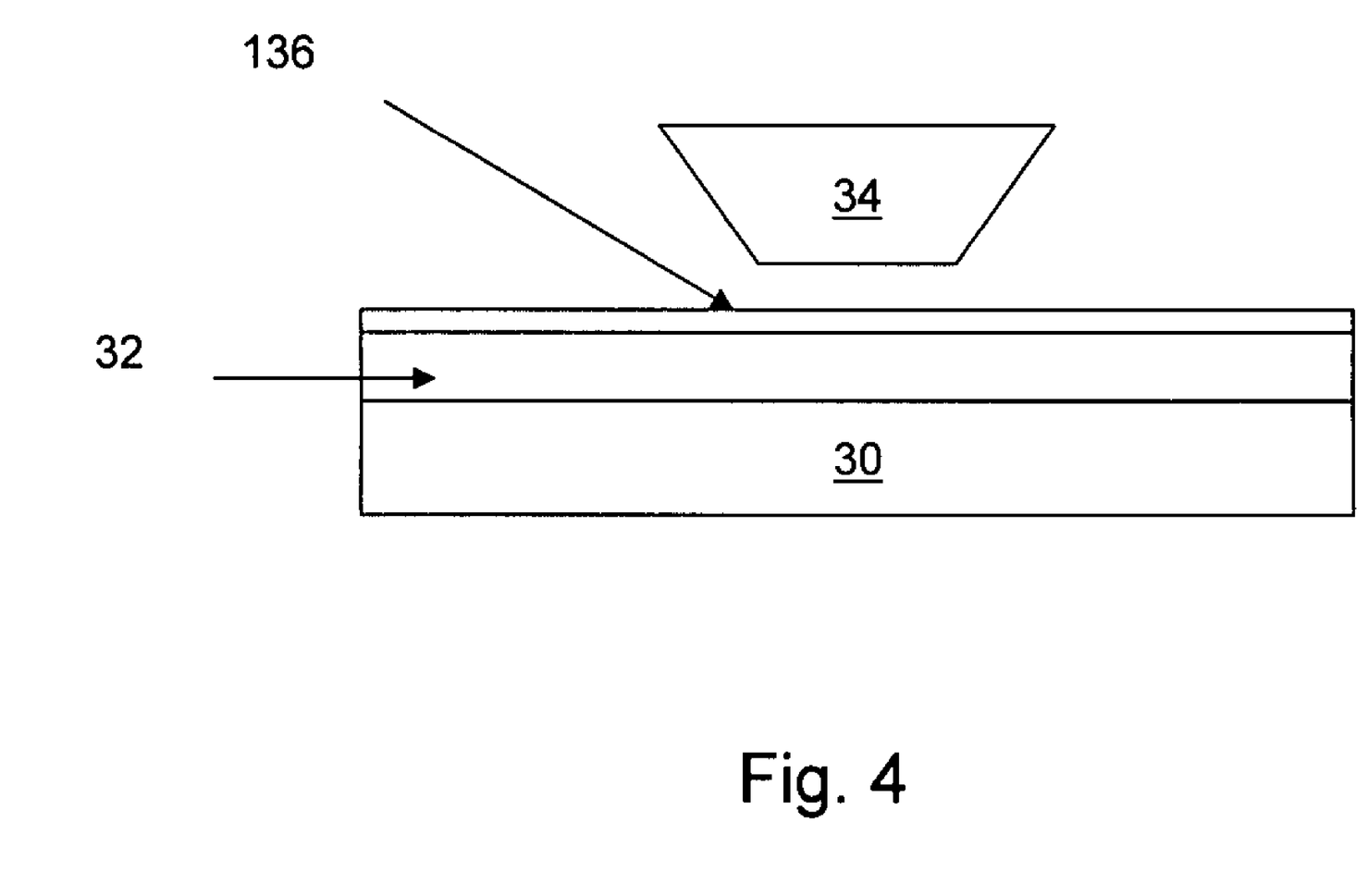
FIG. 4 is an elevation view of a carbon based semiconductor coated in a dense phase doping agent precursor configured in accordance with one embodiment of the present invention.

As illustrated in FIGS. 3A-3E, block diagrams illustrating the steps of producing carbon based electronics construction configured according to one embodiment of the present invention. The method provides a carbon layer 32. The carbon layer, may, in one embodiment be disposed upon a substrate 30. The carbon layer 32 may comprise a layer of Diamond-like Carbon, a Single Walled Nanotube mat, or a layer of graphene. One skilled in the art will readily appreciate that other carbon based molecules having sp2 or a combination or sp2 and sp3 bonding may be employed in similar ways. In one such embodiment, a single walled nanotubes mat may be configured from at least one single walled nanotube, split along its longitudinal axis. What remains is a sheet of sp2 bonded carbon with a thickness on the order of a few Angstroms, structurally analogous to graphene. Mats or layers of graphene, or Diamond-like carbon may be deposited using chemical vapor deposition or other known techniques. These mats or layers may, in accord with one embodiment of the present invention, be aligned with a laser 34. In one embodiment, this laser 34 is a stepper laser. In one embodiment of the present invention, the laser 34 may be configured with lenses and optical components 60 and other components configured of or coated with materials resistant to chemical attack, including, but not limited to sapphire, diamond-like carbon or other suitably resistant coatings. Between the surface of the carbon wafer 32 and the chemically resistant laser 34 a flow of fluid 36 is introduced. The fluid may be in either the gaseous or liquid phases, or such other phases as are best suited to a particular doping agent. As illustrated in FIG. 4, alternative embodiments where the doping agent is applied by spinning a layer of condensed phase doping agent or doping agent precursor 136 on the surface of the carbon wafer 32. The fluid 36, 136 may comprise desired doping agents or their precursors. Doping agents may be selected based on the electrical characteristics of the doped carbon structure and on the response of the doping agent or its precursors to photonic exposure.

Referring again to FIGS. 3A-3F, the carbon layer 32 is then selectively irradiated with laser light, illuminating only those areas of the layer where the circuit design requires doping 38, 40. Depending on the doping agent used, the resulting doped regions 39 are may be either N-type regions 40, P-type regions 38, highly electrically conductive regions 50, or electrically insulative regions 42. As the light 61 passes through the fluid flow 136, 36, into the carbon layer 32, carbon to carbon bonds are excited, facilitating bonding between the carbon layer 32 and the doping agent 136, 36. The same light exposure effects a dissociation of precursor molecules 136, 36, resulting in a release of doping agent radicals or other excited state molecules. Having excited state carbon bonds in close proximity to excited state doping agents or doping agent radicals markedly increases adsorption in irradiated areas, while leaving non-irradiated areas substantially free of doping agents, that is with a level of doping agent inadequate to significantly effect the electrical properties of the carbon.

Figure 5:
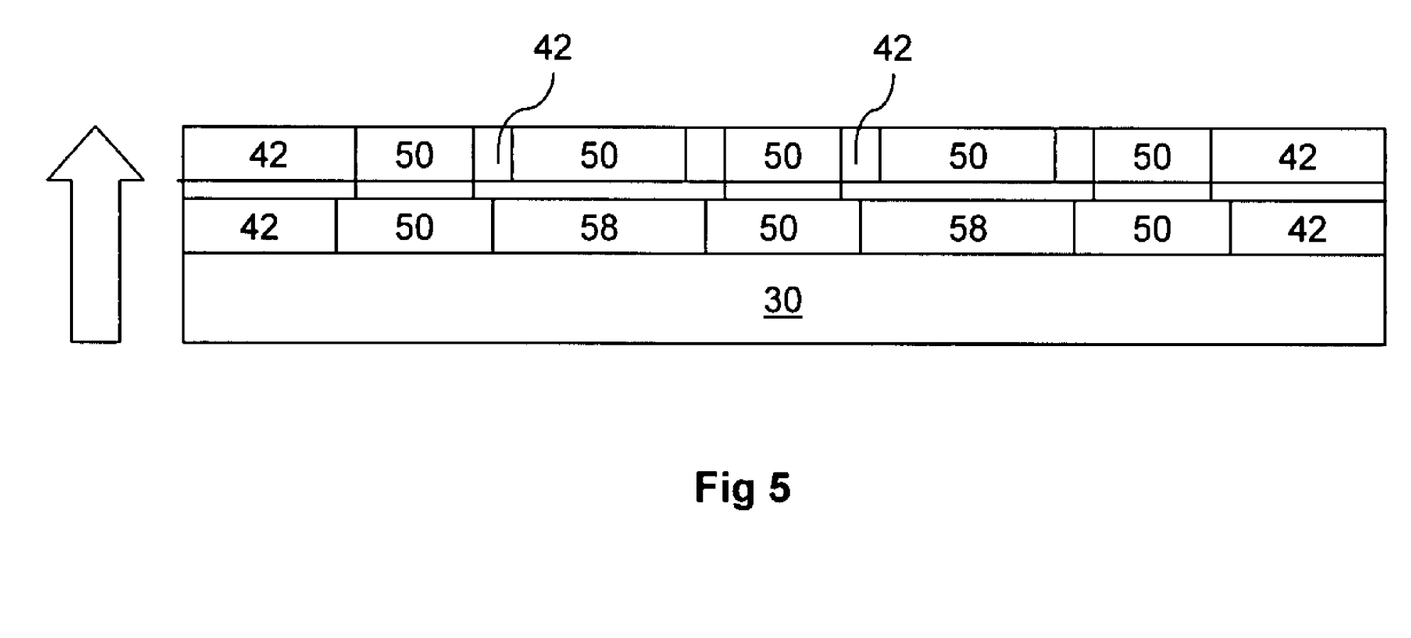
FIG. 5 is an elevation view of a three dimensional multilayer carbon based semiconductor circuit being successively built up by the deposition and processing of carbon based layers configured in accordance with one embodiment of the present invention.

Successive layers of carbon may be deposited and doped in this way, simply by depositing a second or subsequent layer of carbon 44, introducing a doping agent fluid 136, 36, and irradiating the fluid and carbon layer 44. As the carbon irradiation and exposure to doping agent occur at the surface of the carbon, layers disposed beneath the top most layer will be uneffected by the process. The building of successive layers permits the construction of three dimensional circuits, such as those illustrated in FIG. 3E and in FIG. 5. FIG. 3E illustrates one embodiment of the present invention wherein horizontal 52 and vertical 54 transistors are shown, as well as a MISFET (Metal Insulator Semiconductor Field Effect Transistor) 56. The production of such a component may be conducted, in accordance with one embodiment of the present invention, in an enclosed environment using automated wafer handling tools. As no photoresist or associated cleaning and etching steps are required, the production of such devices may be carried out in a closed environment, minimizing wafer handling and any attendant contamination. A similar process may be employed to prepare an inverter, a simple example of which is shown in FIG. 5.

Describing now in more detail, the three dimensional circuit configured according to one embodiment of the present invention is illustrated in FIG. 3E. The doped wafer device 10 is formed of layers of single walled nanotube mats with selective areas of each successive mat doped to create N 40, P 38, and conductive regions 50. From the foregoing description, one skilled in the art will readily appreciate that instead of single walled nanotube mats, other layers of sp2 and or sp3 bonded carbon may be used, such as graphene. As is also well known in the art, the juxtaposition of doped N 40 and P 38 produces transistors. In one embodiment of the present invention, such juxtaposition may be obtained in a single layer, producing a "horizontal" transistor 52, or may be produced by the superposition of alternating doped layers, producing a "vertical" transistor 54. Vias or conductive elements 50 may be formed within the structure to connect the transistors and link these transistors contacts with external components.

Contacts 64 for carbon based electrical components configured according to on embodiment of the present invention may be of indium or other suitable material, and may be configured to provide for flip chip configuration or bump bonding. Examples of flip chips are well known to those skilled in the art.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A system for the manufacture of carbon based electrical components, the system comprising:
   an ultraviolet light source;

a substrate receiving unit whereby a substrate bearing a first layer of carbon based semiconductor is received and disposed beneath said ultraviolet light source;

a mask disposed between said ultraviolet light source and said first layer of carbon based semiconductor;

a doping agent precursor source; and environmental chemical controls configured such that light from said ultraviolet light source irradiates a doping agent precursor and said first carbon layer.

2. The system according to claim 1 wherein said ultraviolet light source emits light in a spectrum selected from the group of spectra consisting of Deep Ultraviolet Light and Extreme Ultraviolet Light.

3. The system according to claim 1 wherein said ultraviolet light source comprises a stepper laser.

4. The system according to claim 1 further comprising an optical component disposed between said mask and said first layer of carbon based semiconductor.

5. The system according to claim 4 wherein said optical component comprises at least one optical component selected from the group of optical components consisting of a lenses, arrays of lenses, diffraction gratings, optical wave guides, modified crystals, Liquid Crystal Displays, Spatial light modulators, prisms, interferimetric lithography, and mirrors.

6. The system according to claim 5 wherein said optical component is resistant to chemical attack.

7. The system according to claim 1 further comprising a docked coating tool communicating with said substrate receiving unit, whereby said substrate wafer is received and coated with said first carbon layer.

8. The system according to claim 7 wherein said docked coating tool is configured to provide at least a second carbon layer and reintroduce said substrate layer and said first carbon layer, together with said second carbon layer to said receiving unit.

9. The system according to claim 1 wherein said doping agent precursor source is a gas supply.

10. The system according to claim 1 wherein said doping agent precursor source is a condensed phase fluid configured to apply said doping agent precursor to said first carbon layer by spinning.

11. The system according to claim 1 wherein said doping agent precursor is selected from the group of doping agent precursors consisting of $COF_2$, $CF_2Cl_2$, $CF_2Br_2$, $CF_3Br$, $CF_3I$, $CF_3NO$, $CO(CF_3)$, Cesium, Potassium, Hydrogen, Oxygen, Fluorine dimer, Chlorine dimer, and Iodine dimer.

12. The system according to claim 1 wherein said environmental chemistry controls are configured to substantially exclude non-selected doping agent precursors.

13. The system according to claim 1 wherein said system comprises components resistant to chemical attack.

* * * * *